United States Patent
Okazaki et al.

(10) Patent No.: US 7,666,573 B2
(45) Date of Patent: Feb. 23, 2010

(54) POSITIVE PHOTOSENSITIVE RESIN COMPOSITION AND METHOD FOR FORMING PATTERN

(75) Inventors: Masaki Okazaki, Ichihara (JP); Hitoshi Ohnishi, Ichihara (JP); Wataru Yamashita, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 169 days.

(21) Appl. No.: 11/988,557

(22) PCT Filed: Jul. 11, 2006

(86) PCT No.: PCT/JP2006/313719

§ 371 (c)(1), (2), (4) Date: Jan. 10, 2008

(87) PCT Pub. No.: WO2007/007730

PCT Pub. Date: Jan. 18, 2007

(65) Prior Publication Data

US 2009/0208868 A1     Aug. 20, 2009

(30) Foreign Application Priority Data

Jul. 14, 2005   (JP)  .............................. 2005-205099
Jan. 19, 2006   (JP)  .............................. 2006-010934

(51) Int. Cl.
    G03F 7/004    (2006.01)
    G03F 7/30     (2006.01)

(52) U.S. Cl. .................... 430/270.1; 430/326; 430/330; 430/906

(58) Field of Classification Search .............. 430/270.1, 430/326, 330, 906
See application file for complete search history.

(56) References Cited

U.S. PATENT DOCUMENTS

| | | | |
|---|---|---|---|
| 6,511,789 B2 | 1/2003 | Naiini et al. | |
| 6,710,160 B2 * | 3/2004 | Yamashita et al. | 528/353 |
| 6,734,276 B2 * | 5/2004 | Yamashita et al. | 528/170 |

FOREIGN PATENT DOCUMENTS

| | | |
|---|---|---|
| JP | 05-011451 A | 1/1993 |
| JP | 06-161110 A | 6/1994 |
| JP | 10-007906 A | 1/1998 |
| JP | 11-148008 A | 6/1999 |
| JP | 11-237740 A | 8/1999 |
| JP | 2002-040655 A | 2/2002 |
| JP | 2002-79634 A | 3/2002 |
| JP | 2002-234961 A | 8/2002 |
| JP | 2003-167336 A | 6/2003 |
| JP | 2003-295430 A | 10/2003 |
| JP | 2005-115249 A | 4/2005 |
| JP | 2005-232195 A | 9/2005 |
| TW | 556045 B | 10/2003 |
| WO | WO 02/10253 A1 | 2/2002 |

OTHER PUBLICATIONS

Shigeru Kubota, et al., "Positive Photoreactive Polyimides. II. Preparation and Characterization of Polyimide Precursors Containing α-(2-Nitrophenyl)Ethyl Ester Side Chains", Mitsubishi Electric Corp., 1987, J. Macromol. Sci-Chem., A24 (12), pp. 1407-1422 (cited in pp. 3 in the Specification).

Recent Polyamides, NTS Corp., 2002 with partial English Translation, pp. 112-113, 280 and 401. (cited in pp. 4 & 8 in the Specification).

* cited by examiner

*Primary Examiner*—John S Chu
(74) *Attorney, Agent, or Firm*—Buchanan Ingersoll & Rooney PC

(57) ABSTRACT

A positive photosensitive resin composition containing 100 parts by weight of a polyimide precursor (A) having a constituent unit represented by the formula (1), 15 to 25 parts by weight of a crosslinking agent (B) represented by the formula (2), and 2 to 5 parts by weight of a photosensitizer (C) generating acid upon irradiation of an actinic ray:

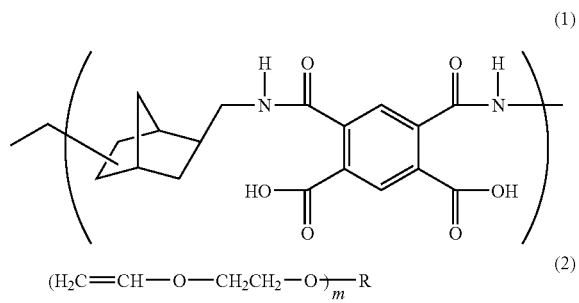

wherein m is an integer of 1 or greater, and R is an aromatic group or an aliphatic group having a valency of 1 or higher. The positive photosensitive resin composition can be developed by using an aqueous solution of alkali metal carbonate, is capable of forming micropatterns, and has excellent thermal resistance and the like. A method for forming a positive pattern, and uses thereof are also provided.

6 Claims, No Drawings

POSITIVE PHOTOSENSITIVE RESIN COMPOSITION AND METHOD FOR FORMING PATTERN

TECHNICAL FIELD

The present invention relates to a positive photosensitive resin composition capable of development using an aqueous alkali solution, which the composition is used for the applications requiring thermal resistance and microfabrication, such as insulating film for printed circuit board wiring, semiconductor coating film and the like, and a method for forming a pattern using the same. In particular, the invention relates to a positive photosensitive resin composition which can form high resolution patterns, and can form a polyimide film having excellent properties such as electrical properties, thermal resistance or the like, a solution of the composition, and a method for forming a positive pattern using the solution.

The invention also relates to a circuit material obtained by the method for forming a pattern, a polyimide obtained from the composition, which exhibits excellent thermal resistance, folding resistance and flame retardance, and uses thereof.

BACKGROUND ART

Polyimide or polybenzoxazole is excellent in thermal resistance, mechanical properties, chemical resistance, electrical insulation properties and the like, and thus, is expected of extended usage in the electrical and electronic applications such as semiconductor surface protecting film, interlayer insulating film in multilayer wiring board, cover coat film for flexible wiring board, and the like. In particular, photosensitive polyimide or photosensitive polybenzoxazole imparted with a photoresist function is a material attracting great interest, in view of shortening the fabrication process significantly.

In recent years, high speed and high capacity of computers or measurement hardware are required even further in the field of communication and information processing technology. Thus, increase in the signal transmission speed in printed circuit boards used therein is still in progress, and a demand for the lowering of dielectric constant is also increasing. Also, due to the concern about the safety problems during operation or the environmental impact, a positive photosensitive resin composition which is capable of development using an aqueous alkali solution is strongly desired.

Heretofore, suggestions have been made for the method of exhibiting positive photosensitivity, which include a method of introducing an o-nitrobenzyl group to a polyimide precursor via an ester bonding (see, for example, Non-Patent Document 1), a method of adding a dissolution inhibitor containing naphthoquinone diazide to a polybenzoxazole precursor or polyhydroxyimide (see, for example, Patent Document 1 and Non-Patent Document 1), and the like. However, the high solubility of the polyimide precursors in alkali water causes problems such as that sufficient resolution cannot be achieved, the structure is restricted to particular structures only, and film shrinkage of the finally obtained film causes a problem. Thus, none of the methods has been put to practical use.

So far, there have been suggested a variety of photosensitive polyimide skeletons. However, the wholly aromatic polyimide precursor reported in Patent Document 2 has problems such as its solubility in alkali developing solutions, or insufficient transparency in the i-line region. Furthermore, a polyimide precursor having an acid dianhydride in the alicyclic form has problems such as insufficient reactivity of the acid dianhydride, susceptibility to coloration, and high price due to the special structure of the acid dianhydride of the monomer. A wholly alicyclic polyimide precursor has a problem of unsatisfactory film formation, while a chain-like aliphatic polyimide has a problem of poor thermal resistance (See, for example, Non-Patent Document 2).

Therefore, a polyimide precursor which has adequate solubility in alkalis, thermal resistance, and high transparency in the i-line region, and which uses an inexpensive monomer, is desired.

Moreover, in recent years, there is an increasing demand for flexible wiring boards in association with diversification of electronic instruments, such as miniaturization, sophistication and the like. A flexible wiring board is generally manufactured by producing a circuit on a flexible printed wiring board in which an electrically insulating film and a metal foil are integrated by lamination, using an adhesive if necessary, and a coverlay is coated over this flexible wiring board for the purpose of protection of the circuit.

The coverlay is required to have thermal resistance, folding resistance and electrical insulation properties, and thus polyimide films have been used therefor. A means to adhere the coverlay that is used in general is a method of laminating a coverlay with desired perforations on a flexible wiring board on which a circuit pattern is formed, by thermal lamination or by pressing.

However, recently, the materials for mounting are required to have even higher performance than conventional materials, and the flexible printed wiring boards are also in rapid progress for micronization of the wiring. The method of aligning in this manner is facing limits in view of low yield, poor workability, difficulty in obtaining accuracy of position or having low accuracy, and the like.

Therefore, in order to solve such problems, a photosensitive insulating resin composition which is applicable to the method of photolithography enabling microfabrication, is being investigated for the use as a photosensitive coverlay. These photosensitive coverlays are provided as dry film type and liquid type, and both types are currently in practical use.

The dry film type photosensitive coverlay is mainly used in a form that a solution of a resin composition containing a photosensitive polyimide or a polyimide precursor in an organic solvent, is coated on a support film and dried, and a protective film such as polyethylene or the like is laminated thereon to prevent any dust attachment. While this type of coverlay has a merit of easy handlability, it is general to use a polymer having an acrylic or methacrylic skeleton with carboxyl group for the coverlay in order to allow development in an aqueous alkali solution, and the polymer has a disadvantage of low thermal resistance or flex resistance after curing (See, for example, Patent Document 3). Furthermore, in recent years, thinner flexible printed wiring boards are desired, and there is a problem in the dry film method that use of support films makes it difficult to reduce the film thickness down to 50 μm or less.

For the liquid type photosensitive coverlay, photosensitive polyimide precursors which result in polyimides imparted with photosensitivity have been suggested previously; however, there is a problem in the handling in an industrial scale because an organic solvent such as dimethylsulfoxide, N-methylpyrrolidone or the like is required in the development process.

Thus, solder resists for printed circuit board have been dominantly used as a photosensitive material that is capable of development in a dilute aqueous alkali solution, but it is difficult to say that the material, which is epoxy-acrylic-based, has sufficient flexibility or thermal resistance (See, for example, Patent Document 4). Also, a resin material used for the coverlay for flexible printed wiring board is required to have sufficient flame retardance property, in addition to thermal resistance, folding resistance and insulation properties. However, according to the reports to date, the current situation is such that halogen-containing compounds such as bromine-containing aromatic compounds or the like, which has high possibility of generating dioxin upon combustion, are used, or toxic antimony compounds are used, for the purpose of exhibiting flame retardance.

As examined above, it can be said that it is preferable to use polyamic acid which can be developed by dissolving in aqueous alkali solutions before thermal curing, and which has alkali-soluble carboxylic acid that disappears by ring-closure after thermal curing. However, conventional polyamic acids have difficulties in controlling the dissolution rate in alkali developing solutions, and in exhibiting a difference in the dissolution rate between the exposed part and the unexposed part. Furthermore, although a film thickness of 10 μm or greater is required to exhibit excellent insulation reliability, there is a problem of very low transmittance for actinic ultraviolet ray with this thickness, when conventional polyamic acids are used.

[Patent Document 1] JP-A 11451/1993
[Patent Document 2] JP-A 161110/1994
[Patent Document 3] JP-A 167336/2003
[Patent Document 4] JP-A 232195/2005
[Non-Patent Document 1] J. Macromol. Sci. Chem., A24, 10, 1407, 1987
[Non-Patent Document 2] Recent Polyimides, NTS Corp., 2002

DISCLOSURE OF INVENTION

It is an object of the present invention to provide a novel positive photosensitive resin composition containing a polyimide precursor, which resin composition has excellent thermal resistance and transparency, and low dielectric constant, which can be developed in an aqueous solution of inexpensive alkali metal carbonate, and which has an ability to form a positive pattern of high resolution, and a method of forming a pattern using the resin composition.

It is another object of the invention to provide uses of the positive photosensitive resin composition, such as a coverlay having excellent thermal resistance, folding resistance, flame retardance and long-term insulation reliability, which contains no halogen-containing compounds and antimony compounds that have high possibility of environmental impact, and contains a polyimide of specific structure; a flexible printed circuit board having the coverlay; and the like.

The inventors of the invention assiduously conducted an investigation in order to solve the above-described problems. As a result, it was found that the problems can be solved by means of a positive photosensitive resin composition combining a polyimide precursor having a norbornane skeleton, a vinyl ether compound and a photoacid generating agent, thus completing the present invention.

Thus, a positive photosensitive resin composition according to the invention comprises 100 parts by weight of a polyimide precursor (A) having a constituent unit represented by the following formula (1), 15 to 25 parts by weight of a crosslinking agent (B) represented by the following formula (2), and 2 to 5 parts by weight of a photosensitizer (C) generating acid upon irradiation of an actinic ray:

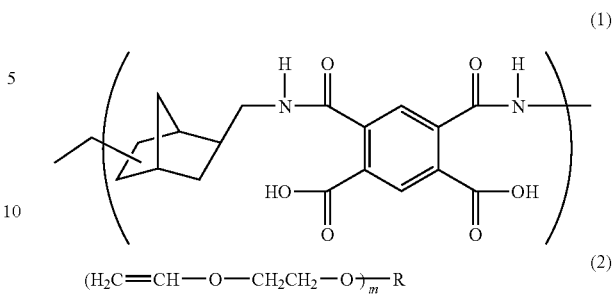

(1)

$(H_2C{=}CH{-}O{-}CH_2CH_2{-}O)_{\overline{m}}R$ (2)

wherein m represents an integer of 1 or larger, and R represents an aromatic group or aliphatic group having a valency of 1 or greater.

The polyimide precursor (A) is obtained by reacting norbornanediamine represented by the following formula (4) with pyromellitic dianhydride in an aprotic polar amide solvent represented by the following formula (3):

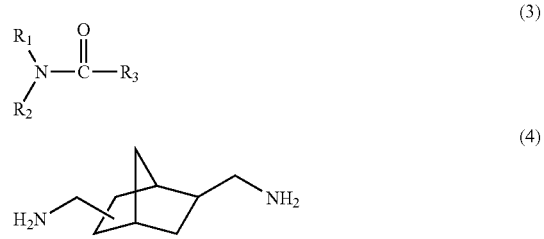

wherein $R_1$ to $R_3$, which may be identical or different, each represent an alkyl group having 1 to 3 carbon atoms.

The aprotic polar amide solvent is preferably N,N-dimethylacetamide.

A solution of the positive photosensitive resin composition according to the invention comprises the positive photosensitive resin composition of the invention and the aprotic polar amide solvent represented by the formula (3).

A polyimide according to the invention has a constituent unit represented by the following formula (5) and is obtained by subjecting the positive photosensitive resin composition of the invention to dehydrating imidation:

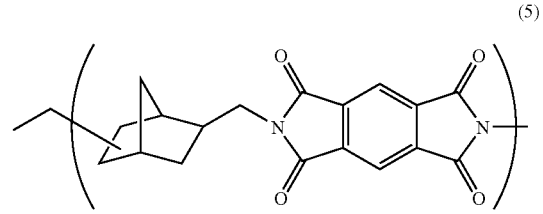

(5)

Furthermore, the polyimide according to the invention is also obtained by removing the solvent from the solution of the invention, and at the same time, subjecting the polyimide precursor (A) having the constituent unit represented by the above formula (1) that is contained in the solution, to dehydrating imidation.

A method for forming a positive pattern according to the invention comprises the steps of coating the solution of the invention on a substrate (Process I); drying the solution-coated substrate at 50 to 160° C. (Process II); exposing the resulting coating film to an actinic ultraviolet ray through a mask pattern, and then heating the film at 80 to 200° C. (Process III); dissolving only the exposed part of the coating film with an aqueous solution of alkali metal carbonate, to develop a positive pattern (Process IV); and thermally treating the developed positive pattern to form a positive pattern containing the polyimide having the constituent unit represented by the above formula (5) (Process V). The aqueous solution of alkali metal carbonate is preferably an aqueous solution of sodium carbonate.

A circuit material according to the invention is obtained by the method for forming a positive pattern of the invention. A coverlay according to the invention is formed by using the positive photosensitive resin composition of the invention, the solution of the invention or the polyimide of the invention. A flexible printed circuit board according to the invention has the coverlay of the invention. A polyimide film according to the invention contains the polyimide of the invention.

The positive photosensitive resin composition of the invention allows development of a thick film with an aqueous solution of alkali metal carbonate, and allows formation of patterns with high resolution, while the cured film (polyimide film) obtained from the composition has excellent thermal resistance, transparency, low dielectric constant, and the like.

The coverlay of the invention has thermal resistance, folding resistance, insulation properties and flame retardance, can be subjected to microfabrication due to the fact that the polyimide precursor has high transparency for the wavelengths in the ultraviolet/visible region, and does not need a support film, thus satisfying the demand for the reduction of film thickness. Moreover, the flexible printed circuit board having the coverlay can be produced at low costs, and thus can be used as a circuit board useful in various electrical and electronic products, thus being industrially highly valuable.

BEST MODE FOR CARRYING OUT THE INVENTION

Hereinafter, the positive photosensitive resin composition according to the present invention and a solution thereof, a method for forming a pattern using the solution, and the uses of the composition will be described in detail.

[Positive Photosensitive Resin Composition]

The positive photosensitive resin composition of the invention comprises 100 parts by weight of the polyimide precursor (A) having the constituent unit represented by the above formula (1), 15 to 25 parts by weight of the crosslinking agent (B) represented by the above formula (2), and 2 to 5 parts by weight of a photosensitizer (C) generating acid upon irradiation of an actinic ray.

<Polyimide Precursor (A)>

The polyimide precursor (A) having the constituent unit represented by the formula (1) is obtained by reacting diaminomethylbicyclo[2.2.1]heptane (hereinafter, abbreviated to "NBDA") represented by the formula (4), with pyromellitic dianhydride. NBDA may be in any isomeric form, such as structural isomers having the aminomethyl group at different positions, optical isomers comprising S-isomer and R-isomer, or the like. These isomers may be contained at any proportion.

In the polyimide precursor (A) used for the invention, other alicyclic diamines can be also copolymerized, within the scope of not impairing the purpose of the invention. The amount of the other alicyclic diamine that can be used is 30% by mole or less, preferably 10% by mole or less, based on the total diamine component.

Specific examples of the other alicyclic diamine include 2,5-diaminomethylbicyclo[2,2,2]octane, 2,5-diaminomethyl-7,7-dimethylbicyclo[2,2,1]heptane, 2,5-diaminomethyl-7,7-difluorobicyclo[2,2,1]heptane, 2,5-diaminomethyl-7,7,8,8-tetrafluorobicyclo[2,2,2]octane, 2,5-diaminomethyl-7,7-bis(hexafluoromethyl)bicyclo[2.2.1]heptane, 2,5-diaminomethyl-7-oxabicyclo[2,2,1]heptane, 2,5-diaminomethyl-7-thiabicyclo[2,2,1]heptane, 2,5-diaminomethyl-7-oxobicyclo[2,2,1]heptane, 2,5-diaminomethyl-7-azabicyclo[2,2,1]heptane, 2,6-diaminomethylbicyclo[2,2,2]octane, 2,6-diaminomethyl-7,7-dimethylbicyclo[2,2,1]heptane, 2,6-diaminomethyl-7,7-difluorobicyclo[2,2,1]heptane, 2,6-diaminomethyl-7,7,8,8-tetrafluorobicyclo[2,2,2]octane, 2,6-diaminomethyl-7,7-bis(hexafluoromethyl)bicyclo[2.2.1]heptane, 2,6-diaminomethyl-7-oxybicyclo[2,2,1]heptane, 2,6-diaminomethyl-7-thiobicyclo[2,2,1]heptane, 2,6-diaminomethyl-7-oxobicyclo[2,2,1]heptane, 2,6-diaminomethyl-7-iminobicyclo[2,2,1]heptane, 2,5-diaminobicyclo[2,2,1]heptane, 2,5-diaminobicyclo[2,2,2]octane, 2,5-diamino-7,7-dimethylbicyclo[2,2,1]heptane, 2,5-diamino-7,7-difluorobicyclo[2,2,1]heptane, 2,5-diamino-7,7,8,8-tetrafluorobicyclo[2,2,2]octane, 2,5-diamino-7,7-bis(hexafluoromethyl)bicyclo[2.2.1]heptane, 2,5-diamino-7-oxabicyclo[2,2,1]heptane, 2,5-diamino-7-thiabicyclo[2,2,1]heptane, 2,5-diamino-7-oxobicyclo[2,2,1]heptane, 2,5-diamino-7-azabicyclo[2,2,1]heptane, 2,6-diaminobicylo[2,2,1]heptane, 2,6-diaminobicylo[2,2,2]octane, 2,6-diamino-7,7-dimethylbicyclo[2,2,1]heptane, 2,6-diamino-7,7-difluorobicyclo[2,2,1]heptane, 2,6-diamino-7,7,8,8-tetrafluorobicyclo[2,2,2]octane, 2,6-diamino-7,7-bis(hexafluoromethyl)bicyclo[2.2.1]heptane, 2,6-diamino-7-oxybicyclo[2,2,1]heptane, 2,6-diamino-7-thiobicyclo[2,2,1]heptane, 2,6-diamino-7-oxobicyclo[2,2,1]heptane, 2,6-diamino-7-iminobicyclo[2,2,1]heptane, 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane and the like. These may be used individually or in combination of two or more species.

In addition to these alicyclic diamine compounds, in the polyimide precursor (A), aromatic diamines, diaminosiloxanes, aliphatic diamines other than alicyclic diamines, or the like can be also copolymerized, within the scope of not impairing the purpose of the invention. The amount of these diamines that can be used is 30% by mole or less, preferably 10% by mole or less, based on the total diamine component.

Among the aromatic diamines, diaminosiloxanes and the aliphatic diamines other than alicyclic diamines, specific examples of the aromatic diamine include the following:

A) p-Phenylenediamine and m-phenylenediamine, each having one benzene ring;

B) 3,3'-Diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, and 1-(3-aminophenyl)-1-(4-aminophenyl)-1-phenylethane, each having two benzene rings;

C) 1,3-Bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, and 2,6-bis(3-aminophenoxy)pyridine, each having three benzene rings;

D) 4,4'-Bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane, each having four benzene rings;

E) 1,3-Bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, and 1,4-bis[4-(4-aminophenoxy)-α,α-dimethylbenzyl]benzene, each having five benzene rings;

F) 4,4'-Bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, and 4,4'-bis[4-(4-aminophenoxy)phenoxy]diphenylsulfone, each having six benzene rings;

G) 3,3'-Diamino-4,4'-diphenoxybenzophenone, 3,3'-diamino-4,4'-dibiphenoxybenzophenone, 3,3'-diamino-4-phenoxybenzophenone, and 3,3'-diamino-4-biphenoxybenzophenone, each having an aromatic substituent H) 6,6'-Bis(3-aminophenoxy)-3,3,3',3'-tetramethyl-1,1'-spirobiindane, and 6,6'-bis(4-aminophenoxy)-3,3,3',3'-tetramethyl-1,1'-spirobiindane, each having a spirobiindane ring.

Diamines having a part or all of the hydrogen atoms on the aromatic rings of the diamines substituted with substituents selected from a fluoro group, a methyl group, a methoxy group, a trifluoromethyl group and a trifluoromethoxy group, can be also used. Similarly, copolymerization can be also conducted with diaminosiloxanes or aliphatic diamines.

Specific examples of the aliphatic diamines include the following:

I) 1,3-Bis(3-aminopropyl)tetramethyldisiloxane, 1,3-bis(4-aminobutyl)tetramethyldisiloxane, α,ω-bis(3-aminopropyl)polydimethylsiloxane, and α,ω-bis(3-aminobutyl)polydimethylsiloxane, which are diaminosiloxanes;

J) Bis(aminomethyl)ether, bis(2-aminoethyl)ether, bis(3-aminopropyl)ether, bis[(2-aminomethoxy)ethyl]ether, bis[2-(2-aminoethoxy)ethyl]ether, bis[2-(3-aminopropoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, and triethylene glycol bis(3-aminopropyl)ether, which are ethylene glycol diamines;

K) Ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane, which are methylenediamines.

These may be used individually or in combination of two or more species.

In the polyimide precursor (A), pyromellitic dianhydride is used as an essential ingredient, but other tetracarboxylic dianhydrides may be used (copolymerized) in combination therewith, within the scope of not impairing the purpose of the invention. The amount of the other tetracarboxylic dianhydride other than pyromellitic dianhydride that can be used is 30% by mole or less, preferably 10% by mole or less, based on the total tetracarboxylic dianhydride component.

The other tetracarboxylic dianhydride may be exemplified by:

aromatic tetracarboxylic dianhydrides such as 3,3',4,4'-biphenyltetracarboxylic dianhydride, 3,3',4,4'-benzophenonetetracarboxylic dianhydride, 3,3',4,4'-oxydiphthalic dianhydride, 3,3',4,4'-diphenylsulfonetetracarboxylic dianhydride and 2,2-di(3,4-dicarboxy)phenyl-1,1,1,3,3,3-hexafluoropropane dianhydride;

aliphatic tetracarboxylic dianhydrides such as cyclobutane tetracarboxylic dianhydride, cyclohexane-1,2,4,5-tetracarboxylic dianhydride, dicyclohexyl-3,4,3',4'-tetracarboxylic dianhydride and bicyclo[2.2.1]heptane-2,3,5,6-tetracarboxylic dianhydride.

The other tetracarboxylic dianhydride may be used individually, or two or more of aromatic species and/or aliphatic species can be also used at the same time.

The polyimide obtained from the polyimide precursor (A) or the composition of the invention may be blocked at the molecular terminals. In the case of being blocked at the molecular terminals, it is preferable that the blocking is performed with a group which is not reactive with amine or dicarboxylic anhydride, as it is known conventionally.

The amount of the dicarboxylic anhydride used for the blocking of the molecular terminals is 0.001 to 1.0 mole, preferably 0.01 to 0.5 moles, per 1 mole of the total diamine compounds. Similarly, the amount of monoamine used for the terminal blocking is 0.001 to 1 mole, preferably 0.01 to 0.5 moles, per 1 mole of the total tetracarboxylic dianhydrides.

The molecular terminal blocking of the polyimide precursor (A) or the like can be performed in the following two ways. That is, when the diamine compound is in excess, and the terminals are blocked with an aromatic dicarboxylic anhydride, the tetracarboxylic dianhydride is used in an amount of 0.9 to less than 1.0 mole, and the dicarboxylic anhydride is used in an amount of 0.001 to 1.0 mole, per 1 mole of the diamine compound. On the other hand, when the tetracarboxylic dianhydride is in excess, and the terminals are blocked with an aromatic monoamine, the diamine compound is used in an amount of 0.9 to less than 1.0 mole, and the aromatic monoamine is used in an amount of 0.001 to 1.0 mole, per 1 mole of the tetracarboxylic dianhydride.

Specific examples of the dicarboxylic anhydride used for the molecular terminal blocking include phthalic anhydride, benzophenonedicarboxylic anhydride, dicarboxyphenyl ether anhydride, biphenyldicarboxylic anhydride, naphthalenedicarboxylic anhydride and the like. Similarly, specific examples of the monoamine include aniline, toluidine, xylidine, aminobiphenyl, naphthylamine, alkylamine and the like.

With respect to the production of the polyimide precursor (A), control of the molecular weight of the produced polyimide precursor (A) can be carried out by adjusting the amount ratio of the tetracarboxylic dianhydride and the diamine compound, and the molar ratio of all of the diamine compounds and all of the acid dianhydrides is preferably set to a range of 0.9 to 1.1. When the molar ratio of all of the diamine compounds and all of the acid dianhydrides is set to 0.9 to 1.1, the inherent viscosity of the resulting polyamic acid, the precursor of polyimide, has a value of 0.1 to 3.0 dl/g, preferably 0.4 to 1.5 dl/g, when measured at a concentration of 0.5 g/dl and at 35° C. in N,N-dimethylacetamide solvent. The weight average molecular weight measured by GPC is 20,000 to 150,000, preferably 30,000 to 100,000.

When the polyimide precursor (A) is a copolymer, there may or may not be limitations in the orderliness or regularity of the two or more repeating units constituting the copolymer, and the type of the copolymer may be any of random, alternating and block. When the copolymer consists of three or more species including diamine and tetracarboxylic dianhydride, the order of addition of each component is arbitrary, and the method of adding these raw materials may be arbitrarily performed by adding altogether at the same time or adding in divided portions. Further, when two or more diamine isomeric mixtures with different composition ratio of NBDA isomers are used, it is possible to produce a polymer having a locally concentrated diamine composition, even in the case of random copolymerization.

The glass transition temperature (Tg) of the polyimide precursor (A) measured by a differential scanning calorimeter (DSC) is 270 to 350° C., preferably 280 to 340° C. The temperature at 5% weight loss in air is 400 to 480° C., preferably 420 to 470° C. Here, the temperature at 5% weight loss in air refers to the temperature at which the weight of a sample is reduced by 5% compared to the sample weight at room temperature, when the sample is heated from room temperature to 900° C. at a heating rate of 10° C./min, while blowing air through at a rate of 20 mL/min using a thermal gravimetric analyzer TGA-50 and a control system TA-60 WS manufactured by Shimadzu Corp.

For the polymerization solvent (D) used for the preparation of the polyimide precursor (A), any solvent can be used as long as the polyimide precursor (A) is soluble therein, but the solvent is preferably the aprotic polar amide solvent represented by the formula (3). When this solvent is used, the polyimide having the constituent unit represented by the formula (5), which is obtained by subjecting the polyimide precursor (A) or the positive photosensitive resin composition of the invention containing the polyimide precursor (A) to dehydrating imidation, has improved colorless transparency.

The aprotic polar amide solvent represented by the formula (3) may be exemplified by, in the case where the monovalent group $R_3$ in the formula (3) is a methyl group, N,N-dimethylacetamide, N,N-diethylacetamide, N,N-dipropylacetamide, N,N-diisopropylacetamide, N-methyl-N-ethylacetamide, N-ethyl-N-propylacetamide, N-methyl-N-propylacetamide, N-methyl-N-isopropylacetamide or the like, and the same applies in the case where $R_3$ is an ethyl group, a propyl group or an isopropyl group. Among these, N,N-dimethylacetamide (DMAc) is most preferred. When DMAc is used, the polyimide having the constituent unit represented by the formula (5), which is obtained by subjecting the polyimide precursor (A) or the positive photosensitive resin composition of the invention to dehydrating imidation, has significantly improved colorless transparency.

The polymerization solvent (D) may be used individually or in combination of two or more species. The amount of the polymerization solvent (D) is such an amount that the polyimide precursor (A) constitutes 3 to 50% by weight, preferably 5 to 40% by weight, and more preferably 10 to 30% by weight, based on the sum of amounts of the polyimide precursor (A) and the polymerization solvent (D).

The polymerization solvent (D) may be mixed with other solvents within the scope of not impairing the purpose of the invention. Specifically, aprotic polar amide solvents such as N-methyl-2-pyrrolidinone, 1,3-dimethyl-2-imidazolidinone, N-methylcaprolactam, hexamethylphosphorotriamide, N,N-dimethylformamide and the like;

aliphatic hydrocarbons such as heptane, hexane, cyclo hexane and the like;

aromatic hydrocarbons such as benzene, toluene, xylene and the like;

alcohols such as methanol, ethanol, propanol and the like;

phenols such as phenol, cresol, xylenol, catechol and the like;

ethers such as dimethyl ether, diethyl ether, 1,4-dioxane, tetrahydrofuran, anisole and the like;

esters such as ethyl acetate, methyl acetate, ethyl formate and the like;

ketones such as acetone, methyl ethyl ketone, methyl isobutyl ketone, diethyl ketone and the like;

amines such as pyridine, triethylamine and the like;

alkylene ethers such as methyl cellosolve, ethyl cellosolve and the like;

sulfur atom-containing solvents such as dimethylsulfone, dimethylsulfoxide, sulfolane and the like;

water; and solvents resulting from substitution of a part or all of the hydrogen atoms present in the molecules of the above-mentioned various solvents with fluorine, chlorine, a nitro group or a trifluoromethyl group; and the like may be mentioned.

The amount of the other solvents is not particularly limited, provided that the addition is made within the scope of not impairing the purpose of the invention, but the amount is usually 30% by weight or less, preferably 20% by weight or less, more preferably 10% by weight or less, and particularly preferably 5% by weight or less, based on the total solvent weight.

The polyimide precursor (A) (polyamic acid) is obtained by reacting the diamine of the formula (4), with pyromellitic anhydride in the presence of the polymerization solvent (D). The reaction temperature is, in an approximate range, preferably in the range of −10° C. to 100° C., and more preferably in the range of near the ice-cooling temperature to around 50° C., while in practice, the temperature is most preferably room temperature. Also, the reaction time may vary depending on the kind of the monomer used, the kind of the solvent, and the reaction temperature, but is usually 1 to 48 hours, and preferably 2 or 3 hours to over ten hours, while in practice, the time is most preferably 4 to 10 hours. In addition, the reaction pressure is sufficient at normal pressure, and pressurization or pressure reduction may be conducted upon necessity.

After completion of the polymerization reaction, the crosslinking agent (B) and the photosensitizer (C) described below are subsequently added. The method of addition or the conditions for addition, such as temperature, pressure or the like, are not particularly limited, and any known methods or conditions can be employed.

<Crosslinking Agent (B)>

The crosslinking agent (B), which consists of a vinyl ether compound represented by the formula (2), can be easily synthesized according to known literatures (for example, Chem. Mater., Vol. 6, pp. 1854-1860 (1994)). The central structure of vinyl ether is not particularly limited, but may be exemplified by the following compounds. These may be used individually or in combination of two or more species.

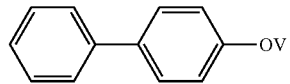

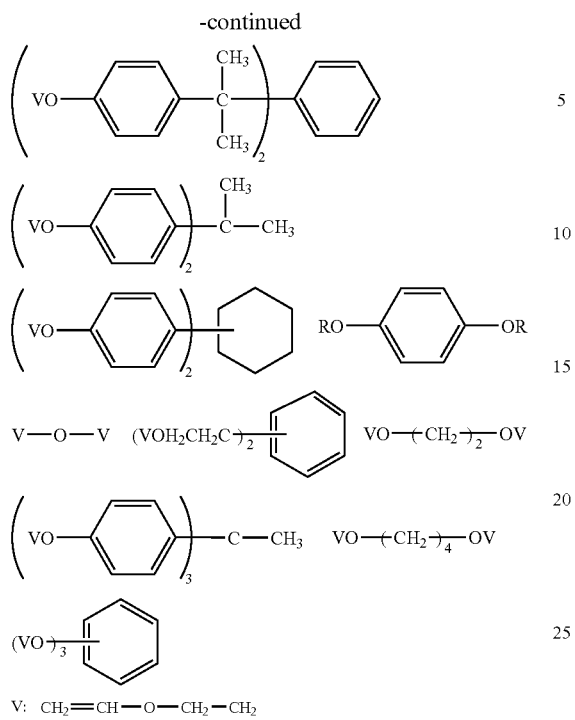

V: CH₂═CH—O—CH₂—CH₂

The amount of the crosslinking agent (B) added is 15 to 25 parts by weight relative to 100 parts by weight of the polyimide precursor (A).

(C) Photosensitizer

The photosensitizer (C) used for the resin composition of the invention is a compound (photoacid generator) generating acid by the action of an actinic ray in the ultraviolet region that is generally used for positive photosensitive resin compositions. The photosensitizer (C) used for the invention is preferably a compound which decomposes under the action of an actinic ultraviolet ray and generates acid, and such known photosensitizers can be used.

Specific examples of the photosensitizer (C) include eight compound groups represented by the following formula groups (6) to (13). These compound groups are said to be more preferred for the present invention, but the photosensitizer is not limited to the following structures, provided that it decomposes upon irradiation of an actinic ultraviolet ray and efficiently generates acid.

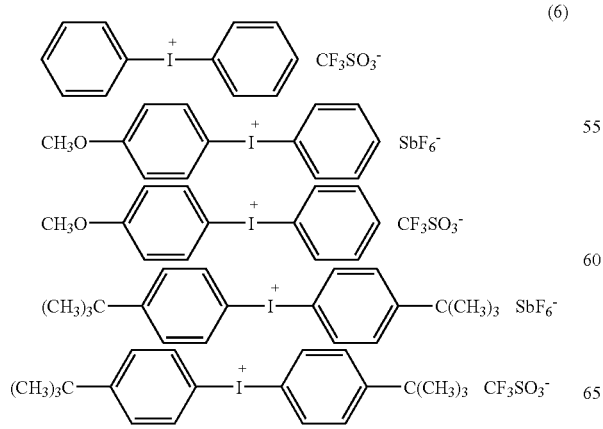

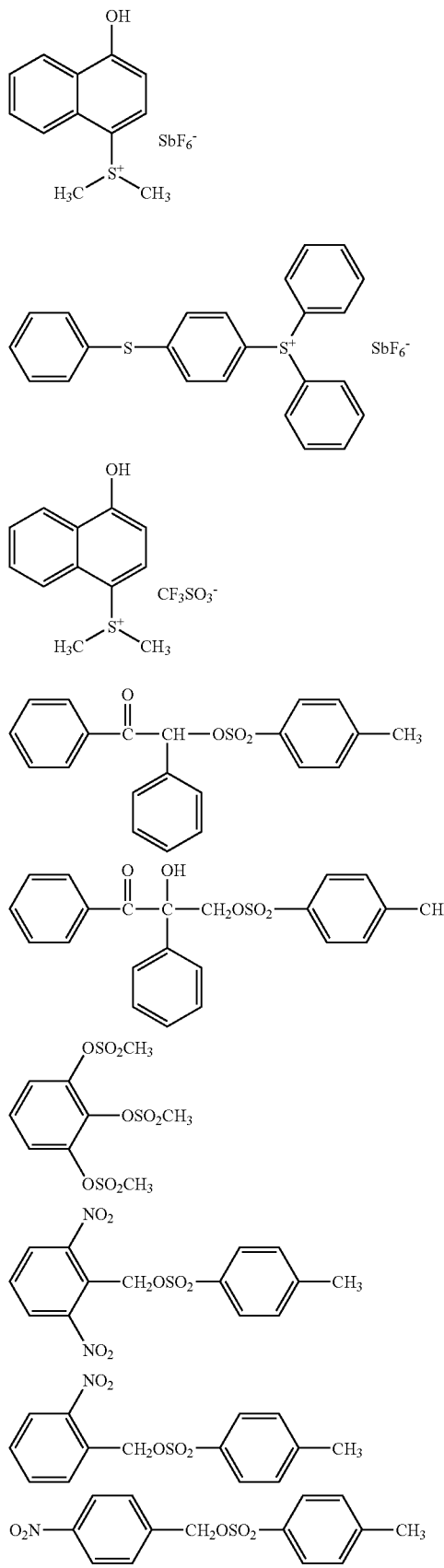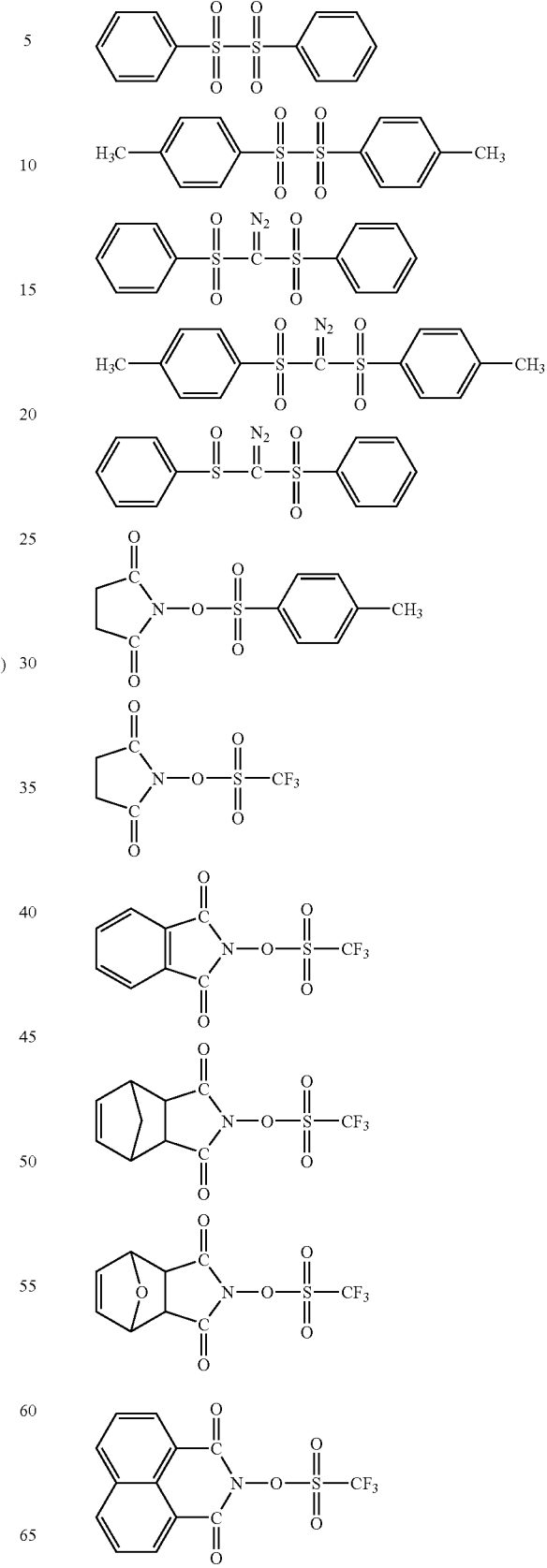

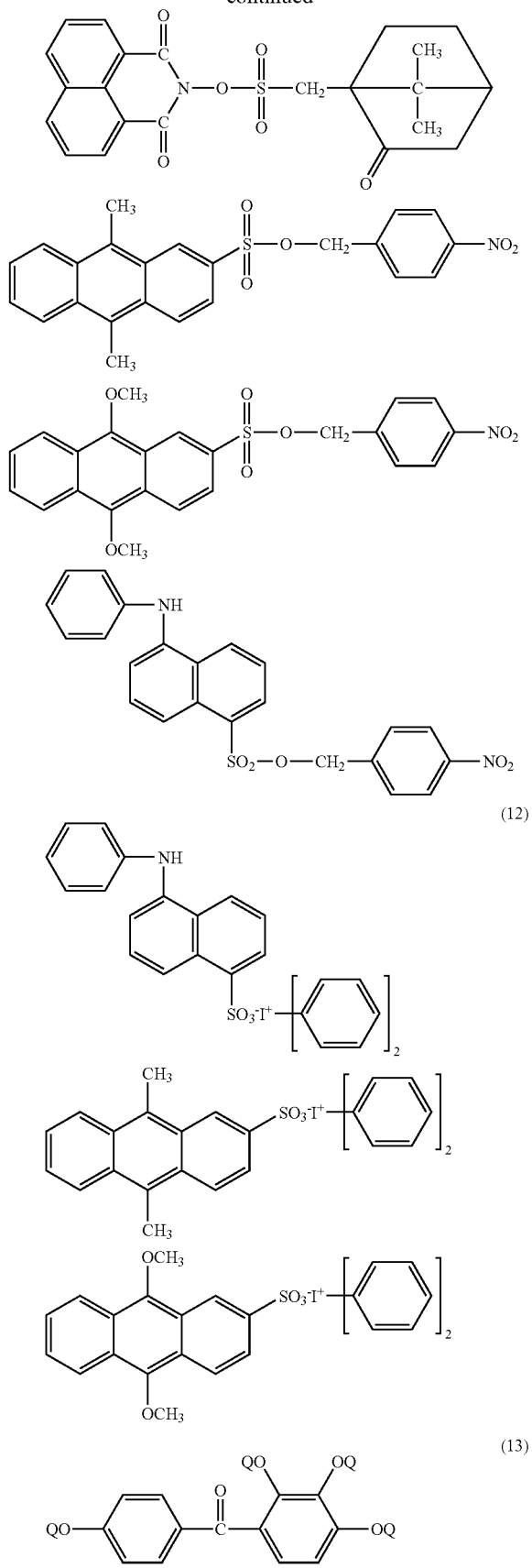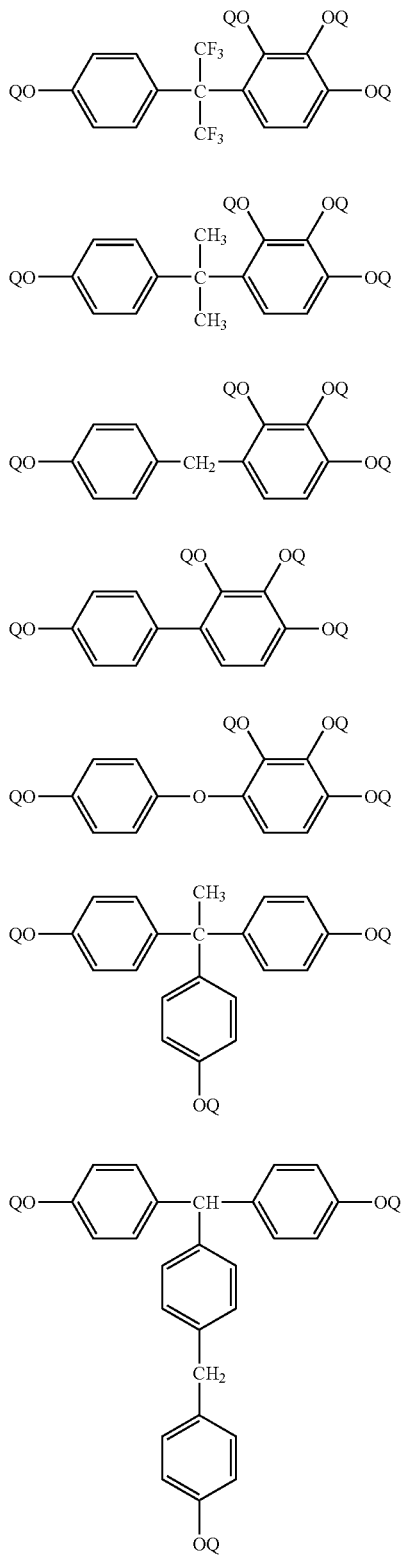
wherein Q is a hydrogen atom or a monovalent group represented by the following formula (14):

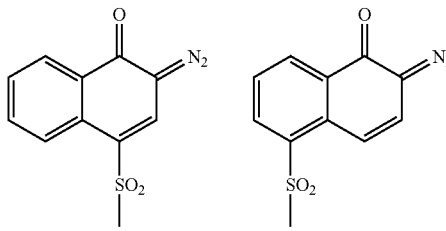

(14)

The photosensitizer (C) may be used individually or in combination of two or more species. The amount of addition is 2 to 5 parts by weight relative to 100 parts by weight of the polyimide precursor (A). When the amount of addition is within the range, the sensitivity to ultraviolet ray is high, and the properties of the coating film are good.

The photosensitive resin composition of the invention may also contain, in addition to the essential components (A) to (C), any other components such as, for example, sensitizer, leveling agent, coupling agent, monomers other than the essential monomers used in the invention, the oligomers of the polyimide precursor (A) or the polyimide used in the invention, and oligomers other than the above-mentioned species, stabilizer, wetting agent, pigment, dye, and the like, according to the purpose of the invention.

[Solution of Positive Photosensitive Resin Composition]

The solution of the positive photosensitive-resin composition of the invention contains the positive photosensitive resin composition and a solvent dissolving the composition. The solvent may be any solvent, as long as the solvent dissolves a positive photosensitive resin composition, but the solvent is preferably the polymerization solvent (D) used to obtain the polyimide precursor (A). The polymerization solvent (D) and the solvent of the solution may be identical or different, but usually it is preferable that the two solvents are identical, in view of producing the solution of the invention. The above-mentioned solvent may be used individually or in combination of two or more species, in the same way as in the case of the polymerization solvent (D). Moreover, the solvent may be used in a mixture with other solvents within the scope of not impairing the purpose of the invention, in the same way as in the case of the polymerization solvent (D). Examples of the other solvents are as described above.

The amount of the solvent used for the solution of the positive photosensitive resin composition of the invention is such an amount that the polyimide precursor (A) in the positive photosensitive resin composition constitutes 3 to 50% by weight, preferably 5 to 40% by weight, and more preferably 10 to 30% by weight, based on the sum of the amounts of the positive photosensitive resin composition and the solvent.

The solution of the positive photosensitive resin composition of the invention is obtained by any known method without particular limitations, but specific examples include:

1) a method of adding once isolated polyimide precursor (A), the crosslinking agent (B) and the photosensitizer (C) to the solvent, 2) a method of adding the crosslinking agent (B) and the photosensitizer (C) to the polyimide precursor (A) solution obtained by the production of the polyimide precursor (A), 3) a method of adding the crosslinking agent (B) and the photosensitizer (C) in advance to the polymerization solvent (D), and then performing the polymerization, 4) a method of adding either the crosslinking agent (B) or the photosensitizer (C) to the polymerization solvent (D), then performing the polymerization, and subsequently adding the crosslinking agent (B) or the photosensitizer (C) that has not been added before the polymerization. For these methods, there are no particular limitations in the order of addition, temperature upon addition, and the time for dissolution.

[Polyimide]

The polyimide of the invention has the constituent unit represented by the formula (5), and can be obtained by subjecting the positive photosensitive resin composition of the invention to dehydrating imidation. Also, the polyimide can be obtained by removing the solvent from the solution of the positive photosensitive resin composition of the invention, and at the same time, subjecting the polyimide precursor (A) contained in the solution to dehydrating imidation.

[Method of Forming Pattern]

Next, the method of forming a positive pattern using the solution of the photosensitive resin composition of the invention will be described. The method of forming a positive pattern of the invention comprises the steps of coating the solution of the invention on a substrate (Process I), drying the solution-coated substrate at 50 to 160° C. (Process II), exposing the resulting coating film to an actinic ultraviolet ray through a mask pattern, and then heating the film at 80 to 200° C. (Process III), dissolving only the exposed part of the coating film using an aqueous solution of alkali metal carbonate, to develop a positive pattern (Process IV), and thermally treating the developed positive pattern, to form a positive pattern containing the polyimide having the constituent unit represented by the formula (5) (Process V).

In the case of contemplating application to semiconductor devices, the solution of the invention is first coated on an intended wafer using a spin coater, and then the coating film is dried at 50 to 160° C., preferably 70 to 140° C. An actinic ultraviolet ray at 365 nm or 436 nm is irradiated on the resulting coating film through a mask having a pattern defined thereon.

Next, the coating film is heated again at 110 to 200° C., preferably 120 to 180° C., subsequently is subjected to dissolution development only at the part exposed to the actinic rays, with the use of an aqueous solution of alkali metal carbonate such as, for example, sodium carbonate, potassium carbonate or the like, and then is rinsed with pure water. The alkali metal carbonate is preferably sodium carbonate in the aspects of low price and the like.

For the development method, methods using spray, paddle, immersion, supersonic and the like can be used. In this way, a desired positive pattern can be obtained on the intended wafer.

In addition, a polyimide coating having excellent film properties can be obtained by thermally treating this coating film, for example, at 180° C. for 2 hours and at 250° C. for 5 hours, to cure the resin composition. Also, an intermediate insulating layer of a multilayer printed circuit board can be also formed by the same method.

Next, the photosensitization mechanism according to the present invention will be described.

In the method for forming a positive pattern, the solution of the invention is spin coated on a substrate, and then dried by heating. At this time, the carboxyl group of the polyimide precursor (A) and the vinyl ether moiety of the crosslinking agent (B) form a hemiacetal bond and result in a crosslinked structure. Subsequently, when the coating film is irradiated with an actinic ray such as ultraviolet ray or the like and heated, with regard to the part exposed to the actinic ray, the photosensitizer (C) decomposes, and acid is generated and diffuses, thereby the hemiacetal bond being cleaved, while the carboxyl group being regenerated. The carboxyl group of this polymer is moderately soluble in an aqueous alkali solution, and as a result, only the part irradiated with the actinic ray such as ultraviolet ray exhibits high solubility in an aqueous alkali solution, while the non-irradiated part is insoluble and does not dissolve. By using this concept of chemical amplification type, the amount of additives other than the resin can be reduced, and it is also possible to form highly sensitive positive patterns.

[Applications]

The photosensitive resin composition of the invention containing the polyimide precursor (A) can be developed in an aqueous solution of alkali metal carbonate, has colorless transparency for the ultraviolet region, and has excellent photosensitivity, thus enabling micropattern formation. In this light, the resin composition is suitably used for circuit materials, flexible printed circuit board, or coverlay. Furthermore, the polyimide layer or polyimide film has excellent thermal resistance and colorless transparency, and also has folding resistance, insulation properties and flame retardance, unlike conventional materials.

[Coverlay]

The coverlay of the invention is formed by using the above-described solution of the invention. In order to produce a coverlay on a flexible printed circuit board, a positive pattern is developed in the same manner as in the method for forming a pattern of the invention, and this developed positive pattern is thermally treated, for example, under a nitrogen atmosphere at 50 to 250° C. for 2 hours and also at 250° C. for 2 hours, to cure the resin composition. Thus, a polyimide layer having excellent film properties can be formed. For the curing conditions, the above exemplification is not limited, and the curing temperature is preferably 100 to 300° C., more preferably 150 to 250° C., and optimally 180 to 220° C. Likewise, the curing time is preferably 0.5 to 12 hours, more preferably 1 to 6 hours, particularly preferably 1 to 3 hours, and optimally 1.5 to 2 hours.

EXAMPLES

Hereinafter, the present invention will be described in detail with reference to Examples, but the invention is not intended to be limited to these Examples. Moreover, the measurement and evaluation of various properties were conducted by the following methods.

(1) Inherent viscosity: Measured at 35° C. in an N,N-dimethylacetamide (DMAc) solution.

(2) E-type mechanical viscosity: Measured by using an E-type viscometer TVH-22H manufactured by Toki Sangyo Co., Ltd., at 25° C. with a rotor No. 4.

(3) Glass transition temperature (Tg): Measured by using DSC-60A manufactured by Shimadzu Corp., at a heating rate of 5° C./min.

(4) Temperature at 5% weight loss (hereinafter, abbreviated to "Td5"): Measured by using TGA-50 manufactured by Shimadzu Corp., in an air at a heating rate of 10° C./min.

(5) Light transmittance: Measured by using Multi-spec-1500 manufactured by Shimadzu Corp.

(6) Solder thermal resistance test: A specimen was prepared by forming a protective film on a copper foil, and this specimen was floated on the liquid surface of molten solder maintained at 255 to 265° C. for 5 seconds, with the protective film side facing upward. The presence or absence of film swelling was confirmed by eye observation.

(7) Flex resistance test: A double-sided board was bent by 180°, and a load of 5 kg was applied on the bent part. This operation was repeated three times, and the presence or absence of peeling at the bend part was observed with an optical microscope.

(8) Migration resistance test: A protective film having a thickness of 25 μm was formed on a polyimide substrate having copper wiring (9 μm thick) at a ratio of line/space=30/30 μm, and a current of 5.5 VDC was applied thereto at 85° C. and 85% RH for 1000 hours. Thus, the presence or absence of short circuit due to deterioration of insulation was confirmed.

(9) Flame retardance test: A protective film having a thickness of 15 μm was formed on a circuit board consisting of two layers of copper layer 12 μm/polyimide layer 25 μm. The flame retardance was measured according to the thin material vertical combustion test of the UL Standards (Subject 94).

Production Example 1

218.12 g (1.00 mol) of pyromellitic dianhydride and 852 g of DMAc were introduced to a reaction flask equipped with a stirrer, a thermometer and a nitrogen inlet tube, and were stirred at room temperature under a nitrogen stream. A mixture of 154.30 g (1.00 mol) of norbornanediamine (NBDA) represented by the above formula (5) and 154 g of DMAc was gradually added dropwise to the flask for 90 minutes. Thereafter, the temperature was raised to 60° C., and the mixture was further stirred for 6 hours to obtain a polyimide precursor. The inherent viscosity of the resulting polyimide precursor was 0.59 dL/g, and the E-type mechanical viscosity of the polyimide precursor solution was 37460 mPa·sec.

The obtained polyimide precursor solution was cast on a quartz plate and heated at 100° C. for 10 minutes under a nitrogen stream to obtain a polyimide precursor film having a thickness of 25 μm. The light transmittance at 365 nm of this film was 90%, and was colorless and transparent. In the infrared absorption spectrum (by the film method) of this film, absorption by the carbonyl group in the amic acid bond was observed at 1640 $cm^{-1}$.

The obtained polyimide precursor solution was cast on a glass plate, and was heated up from room temperature to 250° C. over 2 hours and calcined at 250° C. for 2 hours, under a nitrogen stream, to obtain a polyimide film having a thickness of 20 μm. The light transmittance at 400 nm of the film was 88%, Tg was 284° C., and Td5 was 454° C. In the infrared absorption spectrum (by the film method) of this film, absorption by the imide ring was observed at 1770 $cm^{-1}$. The above results are summarized in Table 1.

Comparative Production Example 1 to 3

Polyimide precursor solutions were obtained in the same manner as in Production Example 1, except that the polymerization solvents presented in Table 1 were used, and the evaluation was carried out in the same manner as in Production Example 1. The evaluation results are presented in Table 1.

Comparative Production Examples 4 to 8

Polyimide precursor solutions were obtained in the same manner as in Production Example 1, except that NBDA in Production Example 1 was replaced with 1,3-bis(aminomethyl)cyclohexane in Comparative Production Example 4; with 4,4'-methylenebisaminocyclohexane in Comparative Production Example 5; with 1,4-cyclohexanediamine in Comparative Production Example 6; with 1,6-hexanediamine in Comparative Production Example 7; and with 4,4'-oxydianiline in Comparative Production Example 8, and the evaluation was carried out in the same manner as in Production Example 1. In addition, polyimide films were produced in the same manner as in Production Example 1, and the evaluation was carried out in the same manner. The evaluation results are presented in Table 1.

TABLE 1

| | Polymerization solvent | Inherent viscosity (dl/g) | E-type mechanical viscosity (mPa · sec) | Tg (° C.) | Td5 (° C.) | Light transmittance at 365 nm of polyimide precursor (%) | Light transmittance at 400 nm of polyimide (%) |
|---|---|---|---|---|---|---|---|
| Prod. Ex. 1 | DMAc | 0.59 | 37460 | 284 | 454 | 90 | 88 |
| Comp. Prod. Ex. 1 | NMP | 0.44 | 30540 | 282 | 436 | 67 | 60 |
| Comp. Prod. Ex. 2 | DMF | 0.42 | 28600 | 270 | 434 | 61 | 56 |
| Comp. Prod. Ex. 3 | DMI | 0.40 | 27500 | 274 | 430 | 63 | 57 |
| Comp. Prod. Ex. 4 | DMAc | 0.68 | 18700 | 258 | 444 | 85 | 83 |
| Comp. Prod. Ex. 5 | DMAc | 1.05 | 75800 | 289 | 353 | 83 | 80 |
| Comp. Prod. Ex. 6 | DMAc | No polymerization | — | — | — | — | — |
| Comp. Prod. Ex. 7 | DMAc | 0.49 | 9850 | 145 | 415 | 89 | — |
| Comp. Prod. Ex. 8 | DMAc | 0.56 | 41200 | 410 | 500 | 0 | 0 |

Example 1

The polyimide precursor solution obtained in Production Example 1 was used without any modification, and to 100 g of the solution, 1.35 g (5 parts by weight based on the polyimide precursor) of the photosensitizer represented by the following formula (15) and 6.75 g (25 parts by weight based on the polyimide precursor) of the crosslinking agent represented by the following formula (16) were added. This solution was filtered through a Teflon (trademark) filter to obtain a solution of a positive photosensitive resin composition.

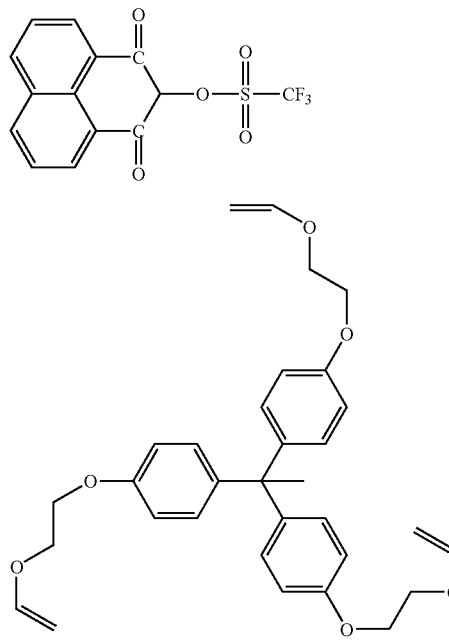

(15)

(16)

The resulting solution was coated on a 4-inch silicon wafer by using a spin coater, and dried in a drying oven at 80° C. for 10 minutes to obtain a coating film of 16 μm. A half of this coating film was covered with Kapton (trademark) film which does not transmit ultraviolet ray, and the coating film was irradiated with an energy of 300 mJ/cm² by a broad band ultraviolet exposure system, and then heated at 120° C. for 5 minutes. Thereafter, the coating film was subjected to paddle development in a 1% aqueous sodium carbonate solution for 60 seconds, and subsequently rinsed with pure water. After this development and rinsing, there was no change in the coating film at the non-irradiated part, but the irradiated part was dissolved and washed away, with no remnant left. Thus, the difference between the irradiated part and the non-irradiated part was clear.

Further, as a positive relief pattern preparation test, the same test was carried out using a test pattern instead of the Kapton (trademark) film on a coating film produced in the same manner as in the above, and a positive relief pattern having only the ultraviolet irradiated part dissolved was obtained. The obtained pattern was observed with an optical microscope, and it was confirmed that the film thickness was 12 μm, and a pattern having a line width up to 40 μm was formed thereon.

Moreover, this pattern was heated up from room temperature to 250° C. over 2 hours, and calcined at 250° C. for 2 hours, under a nitrogen stream to complete polyimidation of the coating film. The resulting polyimide film maintained good pattern forming ability. In the infrared absorption spectrum (by the KBr method) of the resulting polyimide film, absorption by the imide ring was observed at 1770 cm⁻¹, and the spectrum pattern was identical to that of the polyimide film of Production Example 1. The above results are summarized in Table 2.

Examples 2 to 4 and Comparative Examples 1 to 4

Positive photosensitive resin composition solutions were obtained in the same manner as in Example 1, by using the predetermined crosslinking agents and photosensitizers indicated in Table 2, and the evaluation was carried out in the same manner as in Example 1. The evaluation results are presented in Table 2.

TABLE 2

| | Crosslinking agent (B) | | Photosensitizer (C) | | Positive relief pattern (μm)/ film thickness (μm) | Appearance of polyimide film |
|---|---|---|---|---|---|---|
| | (g) | (parts by weight) | (g) | (parts by weight) | | |
| Ex. 1 | 6.75 | 25 | 1.35 | 5 | 40/12 | Good |
| Ex. 2 | 6.75 | 25 | 0.54 | 2 | 40/11 | Good |
| Ex. 3 | 4.05 | 15 | 0.54 | 2 | 40/10 | Good |
| Ex. 4 | 4.05 | 15 | 1.35 | 5 | 40/11 | Good |
| Comp. Ex. 1 | 6.75 | 25 | 1.62 | 6 | — | Cracking generated, unable to form film |
| Comp. Ex. 2 | 6.75 | 25 | 0.27 | 1 | No difference in dissolution rate, unable to develop | — |
| Comp. Ex. 3 | 8.10 | 30 | 0.54 | 2 | — | Cracking generated, unable to form film |
| Comp. Ex. 4 | 2.70 | 10 | 0.54 | 2 | Completely dissolved in developing solution | — |

Comparative Example 5

The evaluation was performed in the same manner as in Example 1, except that a 1% tetramethylammonium hydroxide solution was used as the developing solution, instead of the 1% aqueous sodium carbonate solution. Both the unexposed part and the exposed part dissolved in the alkali developing solution, and no difference was observed.

Comparative Example 6

The evaluation was performed in the same manner as in Example 1, except that a 1% sodium hydrogen carbonate solution was used as the developing solution, instead of the 1% aqueous sodium carbonate solution. Both the unexposed part and the exposed part did not dissolve in the alkali developing solution, and no change was observed.

Example 5

By using a solution of the positive photosensitive resin composition obtained in the same manner as in Example 1, the positive relief pattern preparation test, solder thermal resistance test, flex resistance test, migration resistance test, and flame retardance test were performed. The positive relief pattern preparation test was carried out in the same manner as in Example 1, except that a 1-ounce rolled copper foil was used in place of the silicon wafer. As a result, it was confirmed that the film thickness was 12 μm, and a positive relief pattern having a line width of up to 40 μm was formed. The solution was coated on a glossy surface of the 1-ounce rolled copper foil for the solder thermal resistance test, flex resistance test and flame retardance test, while the solution was coated on a substrate for migration resistance evaluation for the migration resistance test. Thereafter, a 1% aqueous sodium carbonate solution was used for spray development at a pressure of 0.15 Pa for 60 seconds, and subsequently washing with water and drying were carried out. Then, imidation was performed by heating up from room temperature to 250° C. over 2 hours, and heating at 250° C. for 2 hours, to obtain a polyimide coating film. During the evaluation of the resulting polyimide coating film, no anomaly was recognized in the appearance after the solder thermal resistance test and after the flex resistance test. Further, in the migration resistance test, no defects were recognized within 1000 hours, and no anomaly was recognized in the appearance of the specimen after the test. The result of the flame retardance test was evaluated to be VTM-0. The results are presented in Table 3.

Comparative Example 7

The same evaluation as in Example 5 was performed by using the polyimide precursor solution obtained in Comparative Production Example 8. No anomaly was recognized in the appearance after the solder thermal resistance test and after the flex resistance test. In the migration resistance test, no defects were recognized within 1000 hours, and no anomaly was recognized in the appearance of the specimen after the test. The result of the flame retardance test was evaluated to be VTM-0. However, the exposed part and the unexposed part of the obtained film showed no difference in the rate of dissolution in the alkali developing solution, and had no photosensitization function. The results are presented in Table 3.

TABLE 3

| | Positive relief pattern (μm)/film thickness (μm) | Solder thermal resistance test | Migration resistance test | Flex resistance test | Flame retardance test |
|---|---|---|---|---|---|
| Ex. 5 | 40/12 | Good | Good | Good | VTM-0 |
| Comp. Ex. 7 | No difference in dissolution rate, unable to develop | Good | Good | Good | VTM-0 |

Example 6

A polyimide film having a thickness of 20 μm was obtained by using the solution of the positive photosensitive resin composition obtained in Example 1, and by casting on a quartz plate, heating up from room temperature to 250° C. over 2 hours and calcining at 250° C. for 2 hours under a nitrogen stream, in the same manner as in Production Example 1. The Tg of the film was 285° C., and Td5 was 453° C. In the infrared absorption spectrum (by the film method) of this film, absorption by the imide ring was observed at 1770 $cm^{-1}$. The spectrum pattern was identical to that of the polyimide film of Production Example 1.

The invention claimed is:

1. A positive photosensitive resin composition comprising:
   100 parts by weight of a polyimide precursor (A) having a constituent unit represented by the following formula (1);
   15 to 25 parts by weight of a crosslinking agent (B) represented by the following formula (2); and
   2 to 5 parts by weight of a photosensitizer (C) generating acid upon irradiation of an actinic ray:

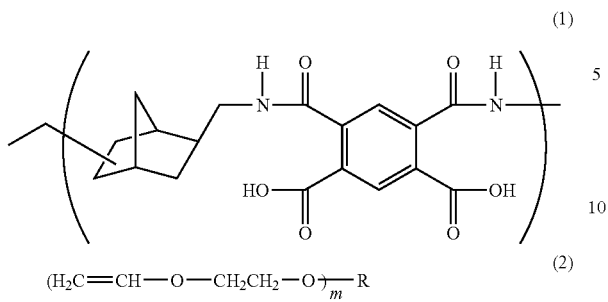

(1)

(2)

$(H_2C=CH-O-CH_2CH_2-O)_m\!-R$ wherein m is an integer of 1 or greater, and R is an aromatic group or an aliphatic group having a valency of 1 or greater.

2. The positive photosensitive resin composition of claim 1, wherein the polyimide precursor (A) is obtained by reacting norbornanediamine represented by the following formula (4) with pyromellitic dianhydride in the presence of an aprotic polar amide solvent represented by the following formula (3):

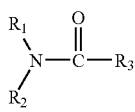

(3)

(4)

wherein $R_1$ to $R_3$, which may be identical with or different from each other, each represent an alkyl group having 1 to 3 carbon atoms.

3. The positive photosensitive resin composition of claim 2, wherein the aprotic polar amide solvent is N,N-dimethylacetamide.

4. A solution of a positive photosensitive resin composition comprising the positive photosensitive resin composition of claim 1, and the aprotic polar amide solvent represented by the following formula (3):

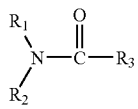

(3)

wherein $R_1$ to $R_3$, which may be identical with or different from each other, each represent an alkyl group having 1 to 3 carbon atoms.

5. A method for forming a positive pattern, which comprises:

coating the solution of claim 4 on a substrate (Process I);

drying the solution-coated substrate at 50 to 160° C. (Process II);

exposing the resulting coating film to an actinic ultraviolet ray through a mask pattern, and then heating the film at 80 to 200° C. (Process III);

dissolving only the exposed part of the coating film with an aqueous solution of alkali metal carbonate, to develop a positive pattern (Process IV); and thermally treating the developed positive pattern to form a positive pattern comprising the polyimide having the constituent unit represented by the following formula (5) (Process V):

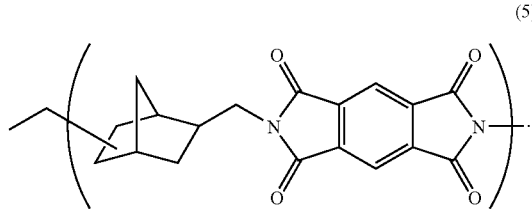

(5)

6. The method for forming a positive pattern of claim 5, wherein the aqueous solution of alkali metal carbonate is an aqueous solution of sodium carbonate.

* * * * *

UNITED STATES PATENT AND TRADEMARK OFFICE
CERTIFICATE OF CORRECTION

PATENT NO. : 7,666,573 B2
APPLICATION NO. : 11/988557
DATED : February 23, 2010
INVENTOR(S) : Masaki Okazaki et al.

It is certified that error appears in the above-identified patent and that said Letters Patent is hereby corrected as shown below:

Title page Item (57) Abstract, please delete

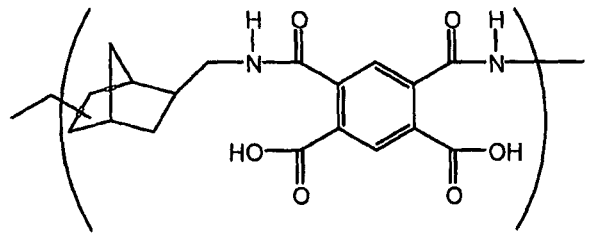

" "

and add

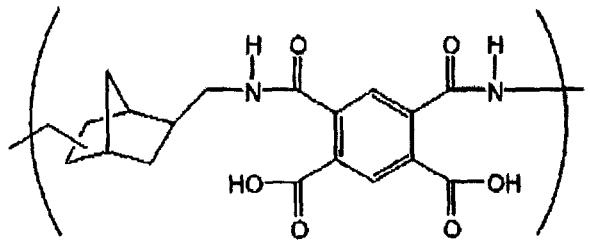

-- -- . (1)

Signed and Sealed this
Thirtieth Day of August, 2011

David J. Kappos
*Director of the United States Patent and Trademark Office*

CERTIFICATE OF CORRECTION (continued)
U.S. Pat. No. 7,666,573 B2

On column 4, beginning at line 5, please delete

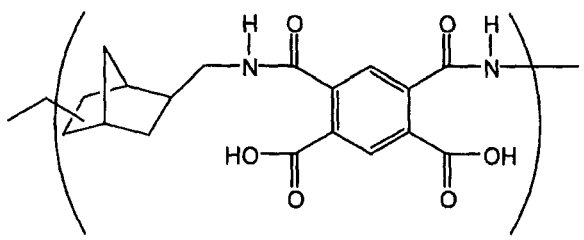

" "

and add

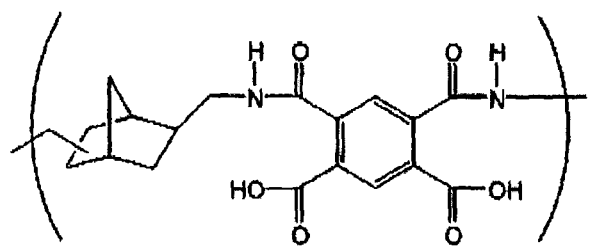

(1)

-- --.

On column 4, beginning at line 50, please delete

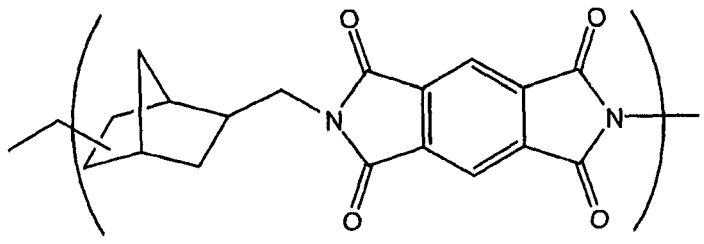

" "

and add

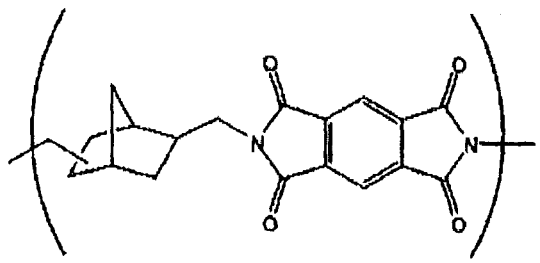

(5)

-- --.

CERTIFICATE OF CORRECTION (continued)
U.S. Pat. No. 7,666,573 B2

At column 25, beginning at line 5, please delete

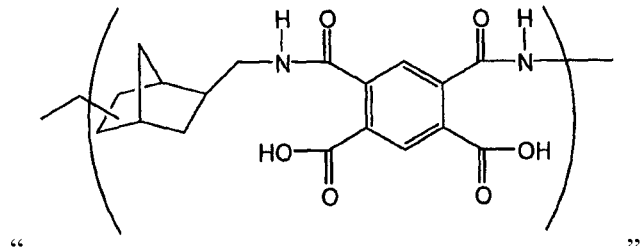

" "

and add

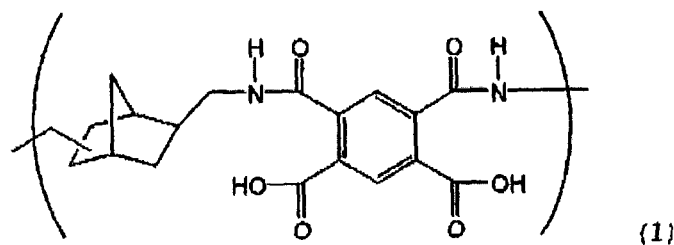

(1)

-- --.

At column 26, beginning at line 35, please delete

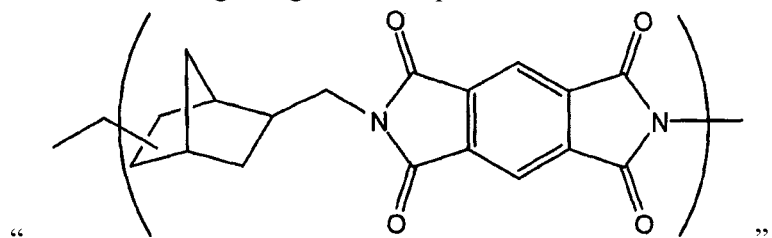

" "

and add

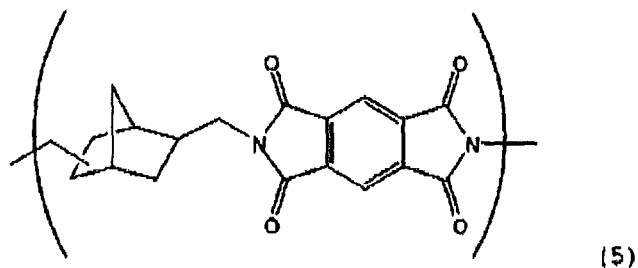

(5)

-- --.